United States Patent [19]

Yamanaka

[11] Patent Number: 5,662,763

[45] Date of Patent: Sep. 2, 1997

[54] MOUNT APPARATUS

[75] Inventor: Kazuyuki Yamanaka, Fujisawa, Japan

[73] Assignee: Kabushiki Kaisha Toshiba, Kawasaki, Japan

[21] Appl. No.: 409,938

[22] Filed: Mar. 23, 1995

Related U.S. Application Data

[63] Continuation of Ser. No. 159,506, Nov. 30, 1993, abandoned.

[30] Foreign Application Priority Data

Dec. 1, 1992 [JP] Japan .................................. 4-321983

[51] Int. Cl.$^6$ .................... B32B 31/00; G05G 15/00
[52] U.S. Cl. .................... 156/358; 156/352; 156/378; 73/150 R; 228/9; 427/9
[58] Field of Search .................... 156/64, 351, 352, 156/358, 378; 73/150 A, 150 R; 228/9, 102; 427/8, 9

[56] References Cited

U.S. PATENT DOCUMENTS 5,062,566 11/1991 Wood et al. .................... 228/9
5,147,491 9/1992 Thomas et al. .................... 156/378 X
5,234,530 8/1993 Freeman, III .................... 156/378 X
5,246,513 9/1993 Yoshida et al. .................... 156/358 X

FOREIGN PATENT DOCUMENTS 3-263839 3/1991 Japan .

OTHER PUBLICATIONS

Partial Translation of Japanese Application, KOKAI Publ. No. 3-263839.

Primary Examiner—David A. Simmons
Assistant Examiner—Paul M. Rivard
Attorney, Agent, or Firm—Finnegan, Henderson, Farabow, Garrett & Dunner, L.L.P.

[57] ABSTRACT

A mount apparatus according to this invention has a mount head for pressing a semiconductor chip on a mount substrate through an adhesive layer. A position sensor for discretely detecting the position of the mount head in a pressing process every predetermined time interval is arranged in the mount head. A non-defect/defect determination unit is also arranged, and the non-defect/defect determination unit performs non-defect/defect determination of the adhesive layer on the basis of the position detected by the position sensor.

12 Claims, 7 Drawing Sheets

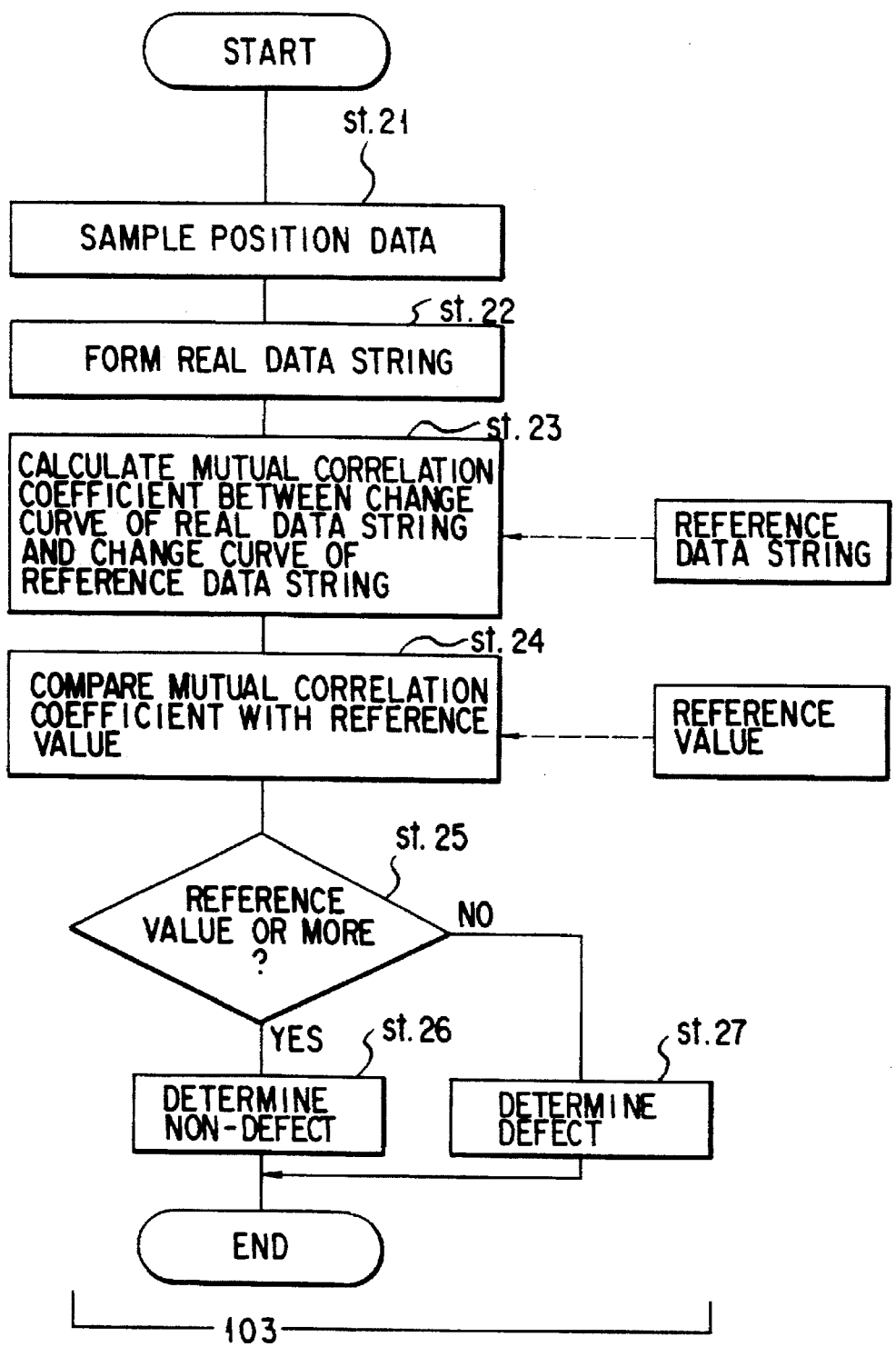
F I G. 8

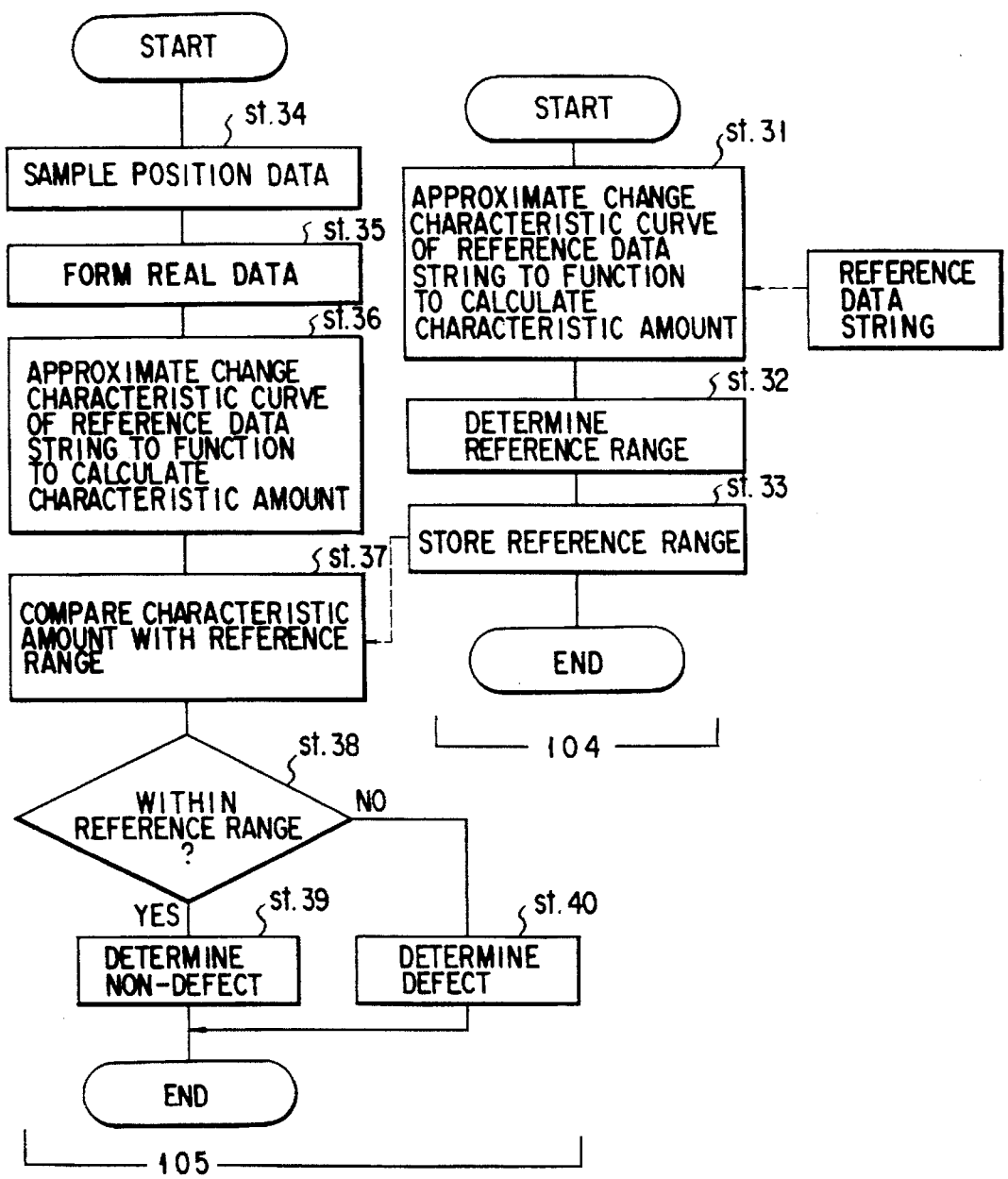
F I G. 9

MOUNT APPARATUS

This application is a continuation, of application Ser. No. 08/159,506, filed Nov. 30, 1993, now abandoned.

BACKGROUND OF THE INVENTION

1. Field of the Invention

The present invention relates to a mount apparatus and, more particularly, to a mount apparatus used in manufacturing a semiconductor device.

2. Description of the Related Art

Conventionally, non-defect/defect determination of an adhesive layer for adhering a semiconductor chip to a mount substrate (e.g., a bed of a lead frame) is performed as follows. That is, a product is picked from a mount apparatus upon completion of a mounting operation, and sampling inspection of the product is performed on an off-line state.

The thickness of each adhesive layer is calculated as follows. That is, the difference between the upper surface of a chip and the upper surface of a mount substrate is measured using a micrometer, and the thickness of the chip itself is subtracted from the difference.

FIG. 1A is a sectional view for explaining a method of measuring the thickness of an adhesive layer, and FIG. 1B is a plan view for explaining a method of measuring a degree of spread of the adhesive layer.

Referring to FIG. 1A, reference numeral 1 denotes a semiconductor chip, and the chip 1 is fixed on a substrate 3 with an adhesive layer 2 consisting of an adhesive. As shown in FIG. 1A, a difference t between the upper surface of the chip 1 and the upper surface of the mount substrate 3 is measured by the above method, and the known thickness tc of the chip 1 is subtracted from the difference t, thereby obtaining a thickness tm of the adhesive layer 2.

The degree of spread of the adhesive layer 2 can be estimated such that an adhesive amount squeezed out of the chip 1 is observed using a microscope.

As shown in FIG. 1B, when the degree of squeeze-out of the adhesive squeezed out of the chip 1 on the mount substrate 3 is observed, it is estimated that the adhesive layer 2 spreads over a region 4 indicated by a hatched region.

In this manner, non-defect/defect determination of the adhesive layer is performed by a cumbersome manual operation in an off-line state in which a product is picked from the mount apparatus.

The non-defect/defect of the adhesive layer considerably depends on the states (viscosity, dropping amount, droplet shape, and the like) of an adhesive dropped on the mount substrate immediately before a mounting operation, and many defects may be continuously formed on a manufacturing line.

However, although mounting operations are sequentially performed by the mounting apparatus, the non-defect/defect of an adhesive layer can be checked only sometimes by sampling inspection. For this reason, when a defect is detected, a large number of defects have already been frequently formed.

In the sampling inspection, since the non-defects/defects of the adhesive layers of all products cannot be checked, defective products flow into the next process, so that troubles may be caused later.

As described above, since there is no technique of performing non-defect/defect determination of an adhesive layer immediately after a mounting operation to detect a defective product in real time, defective products are continuously formed, and the defective products flow into the next process line, thereby causing troubles. More particularly, the former decreases a production yield, and the latter cannot help stopping the production line, thereby decreasing a throughput.

SUMMARY OF THE INVENTION

The present invention has been made in consideration of the above problems, and has as its object to provide a mount apparatus capable of performing non-defect/defect determination of an adhesive layer immediately after a mounting operation and detecting a defective product in real time.

In order to achieve the above object, according to the present invention, there is provided a mount apparatus comprising a pressing unit for pressing an object to be pressed including a semiconductor element on a mount substrate through an adhesive layer, a position detecting unit for detecting a position of the pressing unit in a pressing process, and a non-defect/defect determination unit for performing non-defect/defect determination of the adhesive layer on the basis of the position detected by the position detecting unit.

According to the first aspect of the non-defect/defect determination unit, the thickness of the adhesive layer is calculated on the basis of a position of the pressing unit in a pressing direction immediately before the pressing process is completed, and non-defect/defect determination of the thickness of the adhesive layer is performed by checking whether the thickness falls within the range of a reference value.

According to the second aspect of the non-defect/defect determination unit, a spread state of the adhesive layer in the prossing process is detected on the basis of change characteristics of the position of the pressing unit in a pressing process. The non-defect/defect determination of a degree of spread of the adhesive layer over the adhesive region is performed on the basis of the spread state.

In the mount apparatus with the above arrangement, the non-defect/defect determination unit for performing the non-defect/defect determination of the adhesive layer. This non-defect/defect determination unit performs the non-defect/defect determination of the adhesive layer on the basis of a position detected by the position detection means. For this reason, the non-defect/defect determination of the adhesive layer can be performed without picking products from the mounting apparatus immediately after mounting operations, and defective products can be detected in real time. For this reason, defective products can be prevented from being continuously formed, and troubles caused by making the defective products flow into the next process line can be prevented, thereby increasing a production yield and a throughput.

As a determining method performed by the non-defect/defect determination unit, a determining method using the thickness of an adhesive layer is known. According to this method, the thickness of the adhesive layer is calculated on the basis of a position of the pressing apparatus immediately before the pressing process is completed. If the calculated thickness falls within the range of a predetermined reference value, it can be determined that the thickness of the adhesive layer is almost equal to that of the adhesive layer of a non-defective product. For this reason, the thickness of the adhesive layer can be determined to be appropriate. If the thickness does not fall within the range, the thickness is not determined to be appropriate because the thickness is excessively large or small.

In addition, there is another determining method using a degree of spread of the adhesive layer. According to this determining method based on a finding that the position of the pressing means is changed in a characteristic manner on the time axis, i.e., that the sinking speed of a semiconductor element is not constant. The spread state of the adhesive layer in the pressing process is detected on the basis of the change characteristics of the position of the pressing unit in the pressing process, and the degree of spread of the adhesive layer over the adhesive region is checked on the basis of this spread state.

The spread state of the adhesive layer depends on the viscosity, dropping amount, and droplet shape of an adhesive. For example, if the adhesive has an excessively hard or soft portion, and the sinking speed at this portion is changed. For example, when the portion is hard, the sinking speed becomes low; when the portion is soft, the sinking speed becomes high.

In addition, the dropping amount is excessively small or large, the sinking speed is changed. Similarly, the height of the droplet shape is excessively low (excessively wide) or excessively high (excessively narrow), the sinking speed is changed.

In this manner, when a change in sinking speed in each time is monitored, the spread state of the adhesive layer can be estimated. Furthermore, when the change in sinking speed is monitored, mixing of a foreign matter (a sinking speed is decreased), the presence of bubbles (a sinking speed is increased), or the like can be estimated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a flow chart showing a sequence for determinating the degree of spread of the adhesive layer;

FIG. 9 is a flow chart showing another sequence for determinating the degree of spread of the adhesive layer.

DETAILED DESCRIPTION OF THE PREFERRED EMBODIMENTS

Figure 1A:
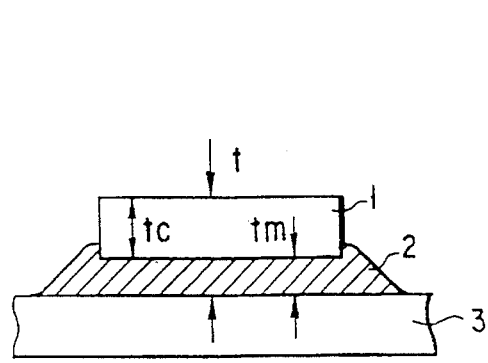
FIG. 1A is a sectional view for explaining non-defect/defect determination of an adhesive layer.
Figure 1B:
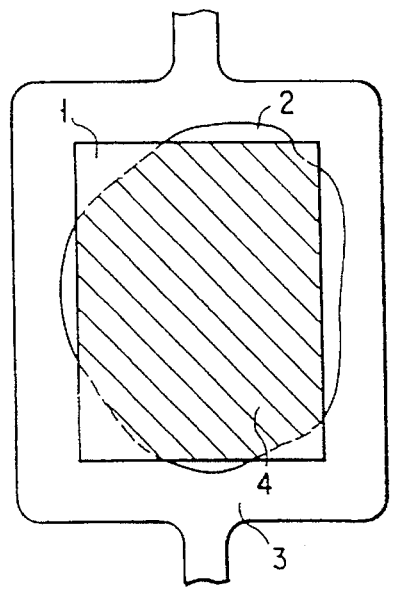
FIG. 1B is a plan view for explaining non-defect/defect determination of the adhesive layer.

An embodiment of the present invention will be described below with reference to the accompanying drawings. In the following description, the same reference numerals denote the same parts throughout the drawings to avoid descriptive repetition.

Figure 2:
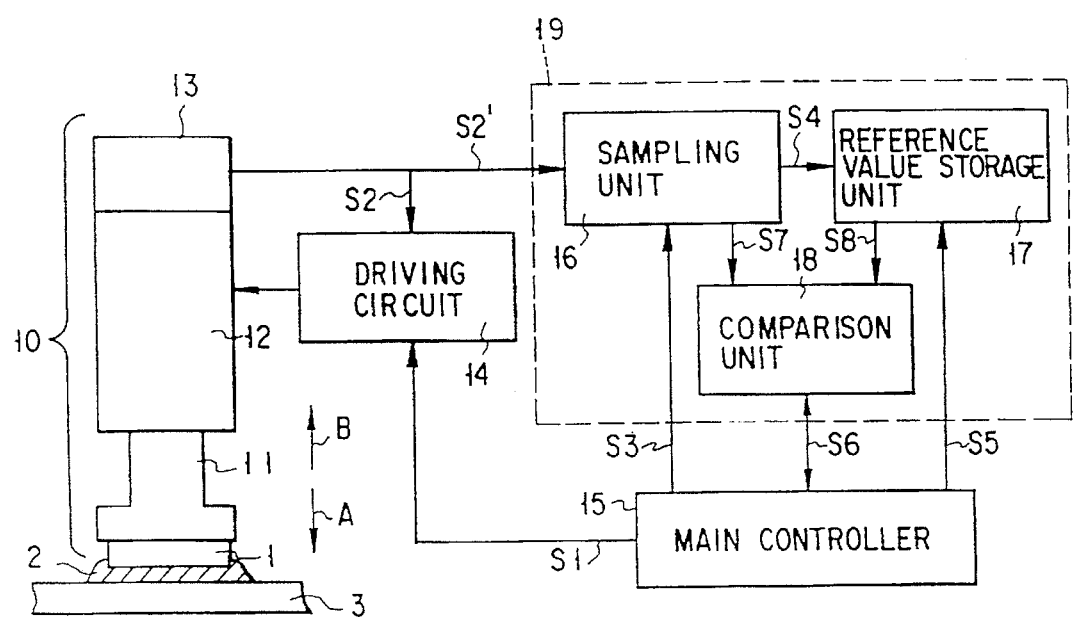
FIG. 2 is a view showing the arrangement of a mount apparatus according to an embodiment of the present invention.

FIG. 2 is a view showing the arrangement of a mount apparatus according to an embodiment of the present invention.

Referring to FIG. 2, a part indicated by reference numeral 10 is a mount head. The mount head 10 holds a semiconductor chip 1, and the chip 1 is pressed and mounted on a substrate 3. An adhesive 2 is dropped on the substrate 3, e.g., a bed of a lead frame, in advance. The mount head 10 of the mount apparatus according to the present invention includes a mount collet 11 and a driver 12 for driving the collet 11 in the directions (vertical direction) indicated by arrows A and B. According to the present invention, the mount head 10 also includes a position sensor 13 for detecting the position of the collet 11 in the vertical direction.

The driver 12 is controlled by a driving circuit 14. An information signal S1 is supplied from a main controller 15 to the driving circuit 14. The information signal S1 represents the desired position and force of the collet 11 in the vertical direction. An output signal S2 output from the position sensor 13 is fed back to the driving circuit 14. In this manner, the driving circuit 14 recognizes the position of the collet 11. Therefore, the driving circuit 14 can control the collet 11 with a desired limited driving force at the desired vertical position of the collet 11. The driving circuit 14 can press the collet only downward with the desired force without controlling the position of the collet 11.

A part indicated by reference numeral 19 is a non-defect/defect determination unit for determining the non-defect/defect of an adhesive layer. The non-defect/defect determination unit 19 is mainly constituted by a sampling unit 16, a reference value storage unit 17, and a comparison unit 18.

A command signal S3 for designating the start and end of a sampling operation is supplied from the main controller 15 to the sampling unit 16. While a load for a mounting operation is applied, an output signal S2' from the position sensor 13 is sampled and stored.

In the storage unit 17, a reference value used for non-defect/defect determination and data (to be referred to as reference data) serving as a reference are stored. The reference data used in this case is data sampled under, e.g., ideal conditions (i.e., data of a non-defective product) or data of a defective product.

The reference data is transferred to the reference value storage unit 17 such that the output signal sampled by the sampling unit 16 is supplied as an output signal S4 on the basis of a command signal from the main controller 15. The reference data transferred as described above is stored in the storage unit 17.

On the other hand, the reference value is externally set, and is supplied as, e.g., an input S5 by an operator from the main controller 15. In this manner, the externally supplied reference value is stored in the storage unit 17.

In the comparison unit 18, real product data (to be referred to as real data hereinafter) sampled by the sampling unit 16 is compared with the reference data stored in the storage unit 17 on the basis of a command signal S6 from the main controller 15, and the comparison result is returned to the main controller 15. As will be described later, the comparison unit 18 also performs arithmetic processing such as calculation of a mutual correlation coefficient and approximation to an exponential function curve or hyperbola.

Figure 3:
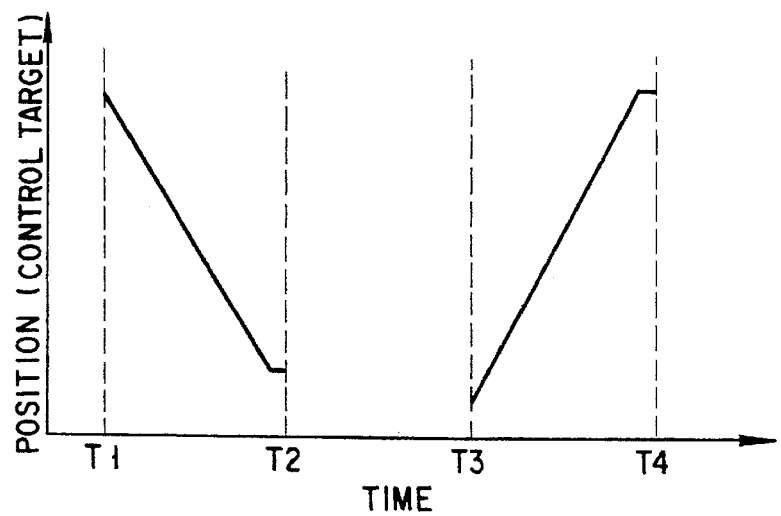
FIG. 3 is a graph showing a relationship between time and the control target of a collet.

FIG. 3 is a view showing an operational control pattern of the collet 11 when a mounting operation is actually performed.

FIGS. 4A to 4E are sectional views showing the states of the collet 11.

Figures 4A, 4B, 4C:
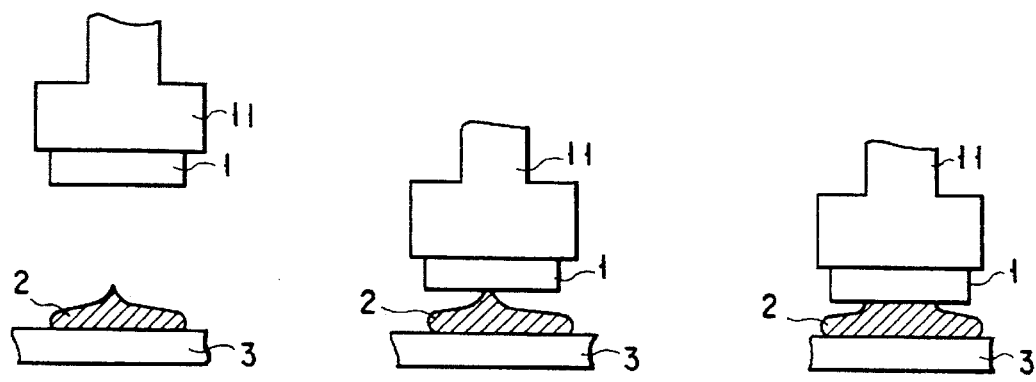
FIGS. 4A to 4E are sectional views showing the states of the collet every predetermined time interval.

At time T1, the collet 11 is positioned above a target portion of the mount substrate 3 while the collet 11 holds the chip 1. This state is a state upon completion of preparation for starting a mounting operation. At this time, the states of the collet 11, the chip 1, the mount substrate 3, and the adhesive layer 2 are shown in FIG. 4A.

In this state, the main controller 15 outputs a command to the driving circuit 14 to move the collet 11 downward.

At time T2, the following state is obtained. That is, the collet 11 is moved downward on the basis of the command, and the lower surface of the chip 1 is brought into slight contact with the adhesive 2 dropped on the substrate 3 in advance. At this time, the states of the collet 11, the chip 1, the mount substrate 3, and the adhesive layer 2 are shown in FIG.

Figures 4D, 4E:
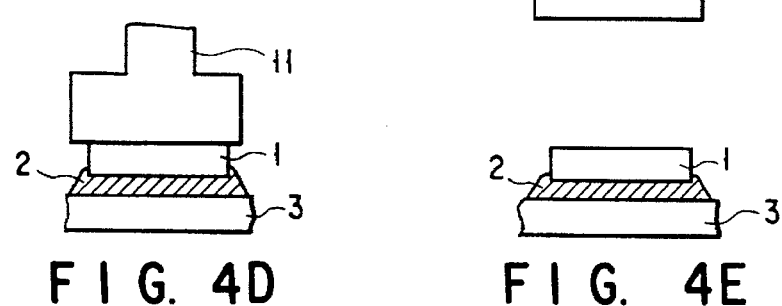

From time T2, the main controller 15 does not control the position of the collet 11, but outputs a command to the driving circuit 14 to press the collet 11 downward with a predetermined force. This is the step of pressing the chip 1 toward the substrate 3 by applying a load for mounting the chip 1. During the interval from time T2 to time T3, a state in which the mount load is kept applied is continued. During this interval, the adhesive 2 gradually collapses to spread over an adhesive region of the lower surface of the chip 1. These states are shown in FIGS. 4C and 4D. As shown in FIGS. 4C and 4D, when the mount load is applied to the adhesive 2, the adhesive 2 gradually spreads.

At time T3, the application of the mount load is completed, the collet 11 releases the chip 1, the collet 11 is moved upward during the interval from time T3 to time T4. FIG. 4E shows the states of the collet 11, the chip 1, the substrate 3, and the adhesive layer 2 at time T4.

Figure 5:
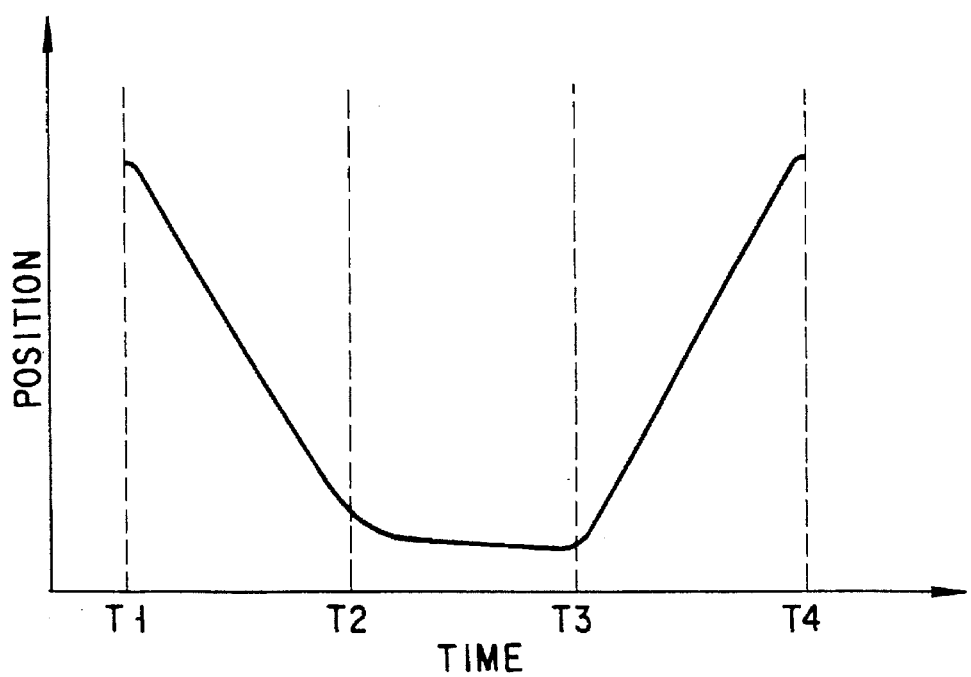
FIG. 5 is a graph showing a relationship between time and the position of the collet.

FIG. 5 is a graph showing actual changes in position of the collet 11 obtained when the collet 11 is controlled in accordance with the pattern shown in FIG. 3. In FIG. 5, the ordinate indicates the position of the collet, and the abscissa indicates time. Time T1 to time T4 in FIG. 5 correspond to time T1 to time T4 in FIG. 3, respectively.

As shown in FIG. 5, during the interval between time T1 and time T2 and the interval between time T3 and time T4, the control pattern in FIG. 5 follows the control pattern shown in FIG. 3, and the position of the collet 11 is changed almost depending on the control pattern shown in FIG. 3. However, during the interval between time T2 and time T3, i.e., while only the mount load is kept applied, control related to the position is not performed, only the force for pressing the collet 11 downward is controlled. For this reason, the position during this interval is changed in accordance with a balance between the mount load and the reactive force of the adhesive. A finally set position depends on the thickness of the adhesive layer upon completion of the mounting operation.

A method of determining the non-defect/defect of an adhesive layer will be described.

The manner of changing the position of the collet 11 during the interval between time T2 and time T3 is an important factor for non-defect/defect determination of the adhesive layer.

Figure 6:
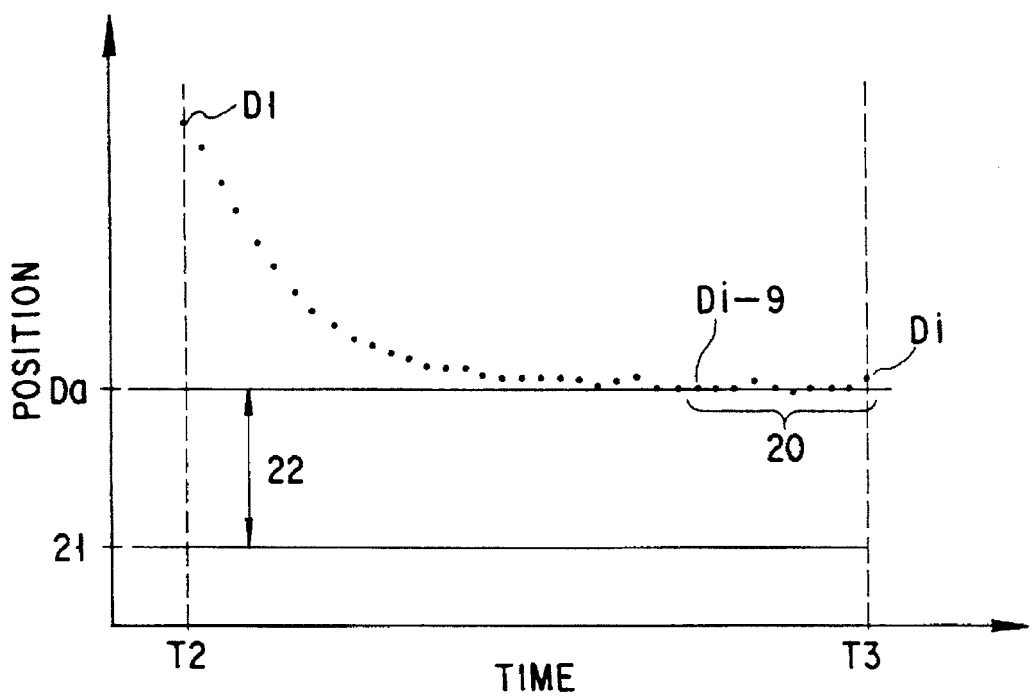
FIG. 6 is a graph showing a sampled data string.

The main controller 15 controls the sampling unit 16 such that sampling of the position data of the collet 11 is started at time T2 and ended at time T3. Upon completion of the sampling, the sampled data is transferred from the sampling unit 16 to the comparison unit 18 (a transfer signal S7 in FIG. 2). FIG. 6 shows a sampled data string. The data string shown in FIG. 6 is constituted by a plurality of data, i.e., from data D1 at time T2 to data Di at time T3.

A method of determining the non-defect/defect of the thickness of an adhesive layer will be described below.

Ten data (from data Di-9 to data Di shown in FIG. 6) indicated by reference numeral 20 in FIG. 6 and obtained immediately before mount load application is completed are extracted from the sampled data string, and a mean value Da of the ten data is calculated by the comparison unit 18.

The data extraction count, i.e., 10, is only an example, and the count can be changed such that an operator inputs a predetermined data extraction count to the main controller 15. A value, i.e., the thickness tm of the adhesive layer, obtained by subtracting the input thickness tc of the semiconductor chip 1 from a difference (indicated by reference numeral 22) between the lower surface of the chip and the upper surface (its position is indicated by reference numeral 21) of the mount substrate 3, which difference is measured and stored using another prepared sequence, is compared by the comparison unit 18 with the upper and lower limit values in the reference range stored in the storage unit 17, thereby checking whether the thickness of the adhesive layer is appropriate.

Figure 7:
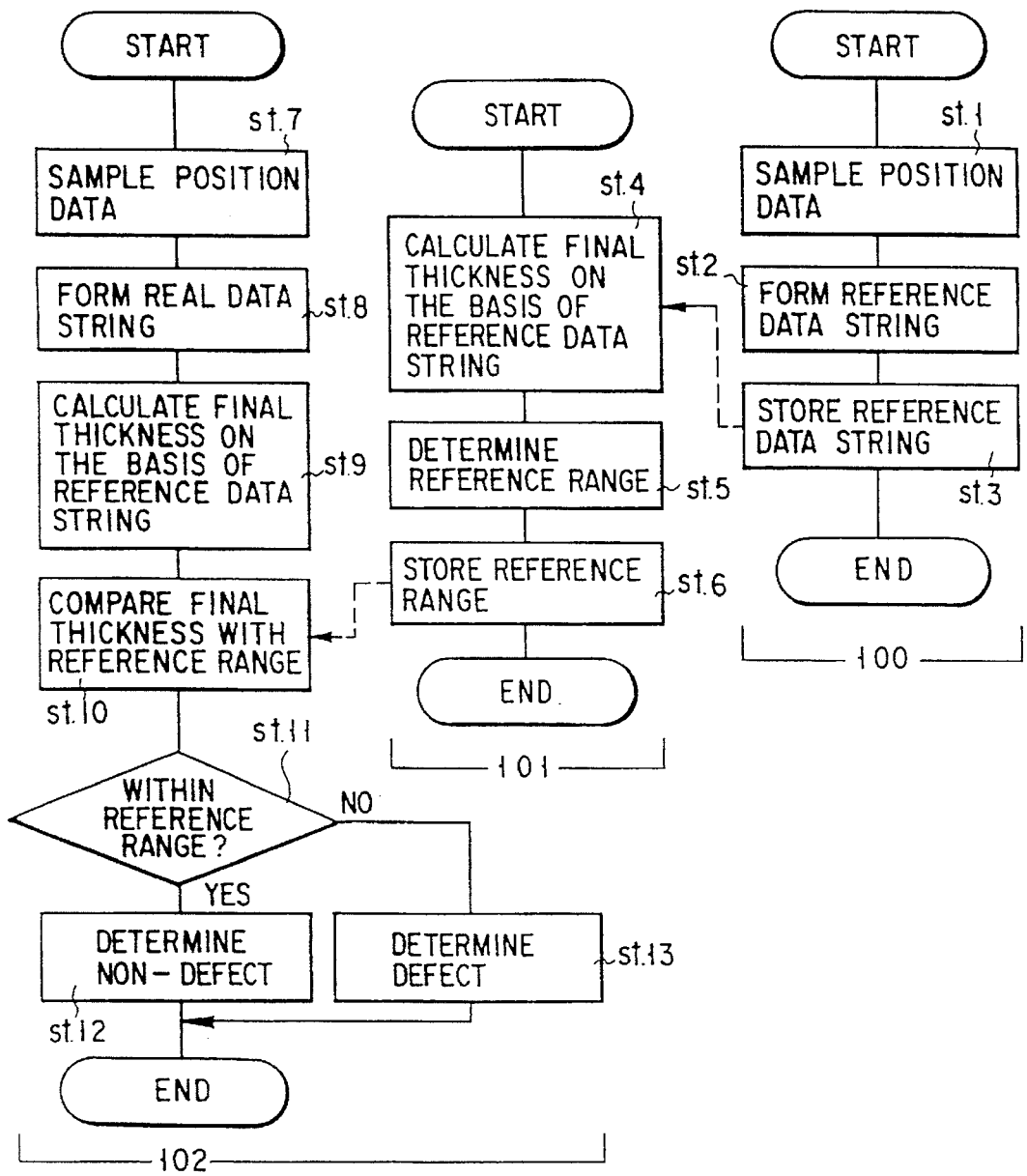
FIG. 7 is a flow chart showing a sequence for determinating the thickness of an adhesive layer.

FIG. 7 is a flow chart showing a sequence for determining the thickness of the adhesive layer.

Referring to FIG. 7, a sequence indicated by reference numeral 100 represents a sequence for forming a reference data string serving as a reference for non-defect/defect determination.

In step 1 (each step will be referred to as st. hereinafter), position data is sampled by the sampling unit 16 using the above sampling method. Upon completion of the sampling, the flow advances to st. 2, and the data string shown in, e.g., FIG. 6, is formed.

At this time, if a sampled product (or sample) is a non-defective product, the flow advances to st. 3, and this data string is stored in the storage unit 17 as a reference data string. The reference data string obtained in this case is used as a reference for non-defect/defect determination later.

The formation of the reference data string is completed by the above sequence.

The number of data strings is not limited to one, and a plurality of data strings may be formed. Furthermore, a plurality of data strings of non-defective products may be formed, the data strings may be averaged, and the averaged data string may be used as a reference data string.

A sequence indicated by reference numeral 101 in FIG. 7 is a sequence for forming a reference range, serving as a reference used for determining a thickness, from the reference data string.

The reference data string is read out from the storage unit 17, and the final thickness of the adhesive layer is calculated on the basis of the reference data string in st. 4. As a method of calculating the thickness, the following method may be used. That is, a predetermined number of data obtained immediately before the load application is completed are extracted from the data obtained immediately after load application is completed, and the data are averaged, thereby calculating the thickness. When the ideal thickness of the adhesive layer, i.e., the thickness of the adhesive layer of a non-defective product, is calculated, the flow advances to st. 5 to determine a reference range.

A method of determining the reference range is determined in consideration of various factors such as the type of an adhesive and the size and weight of a chip. When the reference range is determined as described above, the flow advances to st. 6 to define the reference range using the upper and lower limit values of the thickness, and the defined reference range is stored in the storage unit 17.

In FIG. 7, a sequence indicated by reference numeral 102 is the sequence for determining the non-defect/defect of the thickness of an adhesive layer of an actual product obtained immediately after a mounting operation.

In st. 7, the position data of the actual product is sampled by the sampling unit 16 using the above sampling method. Upon completion of the sampling, the flow advances to st. 8. For example, the data string shown in FIG. 6 is formed, and the data string is used as a real data string.

Upon completion of forming the real data string, the flow advances to st. 9, a final thickness tm of the adhesive layer is calculated using the above method on the basis of the real data string. When the thickness tm is calculated, the flow advances to st. 10 to read out the reference range from the storage unit 17, and the final thickness tm of the actual product is compared with the reference range.

Thereafter, the flow advances to st. 11. If the final thickness tm falls within the reference range (Yes), a non-defect is determined as shown in st. 12. If the final thickness tm falls within the reference range (No), a defect is determined as shown in st. 13.

A method of determining a degree of spread of an adhesive over an adhesive region will be described below.

In this embodiment, two determination sequences will be described. Of these sequences, a sequence capable of performing most proper determination is preferably selected and used in consideration of the viscosity of an adhesive, the area of an adhesive region, and the like.

According to the first determination sequence, a mutual correlation coefficient between a curve representing the change characteristics of the real data string and a curve representing the change characteristics of the reference data string sampled under, e.g., ideal conditions, is calculated, a degree of similarity between these curves is examined, and the degree of similarity is used as an index for non-defect/defect determination. This calculation is performed by the comparison unit 18, and the reference data string stored in the storage unit 17 is transferred to the comparison unit 18 before the calculation. The value of the mutual correlation coefficient is compared with the reference value stored in the storage unit 17, and a comparison result representing whether the value of the mutual correlation coefficient is larger or smaller than the reference value is sent to the main controller 15. If the value is larger than the reference value, a non-defect is determined; and if the value is smaller than the reference value, a defect is determined.

FIG. 8 is a flow chart showing the first determination sequence.

Referring to FIG. 8, a sequence indicated by reference numeral 103 is a sequence for determining the non-defect/defect of a degree of spread of an adhesive layer of an actual product formed according to the first procedure.

In st. 21, position data of the actual product is sampled by the sampling unit 16 using the above sampling method. Upon completion of the sampling, the flow advances to st. 22. For example, the data string shown in FIG. 6 is formed, and this data string is used as a real data string.

Note that, since the operations in st. 21 and st. 22 are the same as those in st. 7 and st. 8 in FIG. 7, st. 21 and st. 22 may be replaced with st. 7 and st. 8.

Upon completion of the formation of the real data string, the flow advances to st. 23. At this time, the reference data string is read out from the storage unit 17, a mutual correlation coefficient between a change curve of the real data string and a change curve of the reference data string is calculated. As the reference data string, the reference data string stored in st. 3 shown in FIG. 7 may be used. When the mutual correlation coefficient is calculated, the flow advances to st. 24 to read out the reference value from the storage 17 and compare the mutual correlation coefficient with the reference value. The flow advances to st. 11. If the mutual correlation coefficient is the reference value or more (Yes), a non-defect is determined as shown in st. 26; if the mutual correlation coefficient is less than the reference value (No), a defect is determined as shown in st. 27. In this case, the mutual correlation coefficient which is the reference value or more means that the change curve of the real data string is considerably similar to the change curve of the reference data string.

According to the second determination sequence, the change characteristics of the reference data string are approximated to a function, and the change characteristics of the real data string are also approximated to the function. A degree of similarity between characteristic terms representing, e.g., inclinations in equations representing this function is examined, and this degree of similarity is used as an index for non-defect/defect determination.

In this embodiment, the sequence will be exemplified by least square approximation performed using an exponential function: $z=a \cdot b^t+c$ as the above function.

In the exponential function: $z=a \cdot b^t+c$, wherein t corresponds to time for T2=0, and z corresponds to the position of the collet 11. The reference data string and the real data string are least-square-approximated to the exponential function, and a degree of similarity between the values of bases b of the obtained equations is used as an index for non-defect/defect determination. Each of the values b is a characteristic amount representing the degree of deflection of the curve obtained by the data string shown in FIG. 6 in the lower left direction of FIG. 6. That is, although the value b generally falls between 0 and 1, as the value b is close to 1, a smooth and flat shape is obtained; as the value b is close to 0, a largely deflected shape is obtained.

The value of the base b of the equation obtained under ideal conditions, i.e., the value of the reference data string, is calculated in advance. The non-defective product range including this value is stored in the storage unit 17 as upper and lower limit reference values. A comparison result representing whether the data string transferred from the sampling unit 16, i.e., the base b of the real data string, falls within the range of the reference values is sent from the comparison unit 18 to the main controller 15. If the base b falls within the range, a non-defect is determined; and if the base b falls outside the range, a defect is determined. These approximations are calculated by the comparison unit 18.

FIG. 9 is a flow chart showing the second sequence.

Referring to FIG. 9, a sequence indicated by reference numeral 104 is a sequence for forming a reference range, serving as a reference for determining a degree of spread, from the reference data string.

The reference data string is read out from the storage unit 17, and the curve representing the change characteristics of the reference data string is approximated to the functional curve: $z=a \cdot b^t+c$ in st. 31 in the same manner as described above to calculate a characteristic amount. In this case, the characteristic amount is a curve represented by the exponential function: $z=a.b^t+c$, and is a characteristic amount especially representing a degree of deflection (degree of bending). When the characteristic amount is obtained, the flow advances to st. 32 to determine a reference range. A method of determining the reference range is determined in consideration of various functions such as the type of an adhesive and the size and weight of a chip. When the reference range is determined as described above, the flow advances to st. 33, and the reference range is defined by, e.g., the upper limit value of the characteristic amount and the lower limit value of the thickness and stored in the storage unit 17.

The sequence indicated by reference numeral 105 in FIG. 9 is a sequence for determining the non-defect/defect of the degree of spread of the adhesive layer of the actual product.

In st. 34, position data of an actual product is sampled by the sampling unit 16 using the above sampling method. Upon completion of the sampling, the flow advances to st. 35. For example, the data string shown in FIG. 6 is formed, and this data string is used as a real data string.

Note that, since the operations in st. 34 and st. 35 are the same as those in st. 7 and st. 8 in FIG. 7, st. 34 and st. 35 may be replaced with st. 7 and st. 8.

Upon completion of formation of the real data string, the flow advances to st. 36, and a curve representing the change characteristics of the real data string is approximated to the functional curve: $z=a.b^t+c$ in st. 31 in the same manner as described above to obtain a characteristic amount. In this case, the characteristic amount is a characteristic amount representing a degree of deflection (degree of bending) as in st. 31. When the characteristic amount is obtained, the flow advances to st. 37 to read out a reference range from the storage unit 17 and compare the characteristic amount of the actual product with the reference range. The flow advances to st. 38. If the characteristic amount falls within the reference range (Yes), a non-defect is determined as shown in st. 39. If the characteristic amount falls outside the reference range (No), a defect is determined as shown in st. 40.

As the function used in the above description, not only the exponential function: $z=a.b^t+c$ but a hyperbola represented by $z.t=d$ may be used. That is, the same determination as that of the sequence shown in FIG. 9 is performed using the value d. This value d is, similar to the value b used in the second sequence, a characteristic amount representing the degree of deflection of a curve formed by a data string in the lower left direction in FIG. 6. That is, although the value d is generally set positive, as the value d is larger, a smooth and flat shape is obtained; as the value d is close to 0, a largely deflected shape is obtained. Note that the sequence used in this case is the same as the procedure shown in FIG. 9. That is, the function shown in st. 31 and st. 36 may be replaced with $z.t=d$.

In addition to these curves, the same determination of a degree of similarity as described above may be performed such that the reference data string and the real data string are approximated to a function represented by an asymptotical curve monotonously decreased to a straight line, a triangular function, or a relatively simple curve such as a function of a parabola. When the line representing the change characteristics is straight, the data strings may be approximated to a function representing a straight line.

The first sequence has an accuracy slightly lower than that of the second sequence because a degree of similarity is determined by a characteristic amount of a curve, such as the degree of bending of the curve as in the second sequence. However, the first determination sequence has the following merit. Even if the data string forms any curve, a degree of similarity between the real data string and the data string obtained under the ideal conditions can be obtained as a positive value having a maximum of 1, i.e., a degree of similarity between the entire shapes, regardless of the shape of the curve. That is, the shapes of the curves themselves representing the change characteristics are compared with each other, and the degree of similarity between curves is determined depending on whether the shapes are similar to each other. For this reason, the first sequence is effective when a curve representing the change characteristics cannot be approximated to any function.

According to the second sequence, high accuracy can be obtained because the degree of similarity of the curves can be determined by the characteristic amounts of the curves such as the degrees of bending of the curves. The curve represents how an adhesive collapses and spreads while a mount load is applied to the adhesive. A preferable determination means for observing a degree of spread of the adhesive over the adhesive region is to determine how the adhesive abruptly collapses and spreads at the beginning of the mount load application. That is, the sinking speed of the chip 1 can be momentarily analyzed in detail. When this sinking speed is mathematically represented, approximation to the function used in the second sequence is obtained. The constants of the equations used in the approximations are preferably used as good indices. Therefore, when a data string represented by a general curve or a straight line and capable of properly extracting a characteristic amount is obtained, the second sequence is preferably selected.

Note that, although setting of use of these determination sequences and setting of functions are properly performed by an operator to the main controller 15, the setting can be performed in the apparatus. For example, the following algorithm or the like is installed in the apparatus. That is, the reference data string is approximated to a plurality of functions, and all the resultant data strings are stored in the storage unit 17. These data strings are compared with the real data string, and a specific function is selected from these functions on the basis of a degree of similarity between the real data string and the obtained data strings (residual sum of squares).

A plurality of data approximated to different functions may be prepared as needed, and non-defect/defect determination may be performed using the data approximated to the different functions in units of intervals. In this case, not only the functions, but also the first and second sequences may be combined with each other. During one interval or all intervals, a plurality of data approximated to different functions can be combined with each other, and logical combinations of the determination results can be used as final determination. In this case, the first and second sequences may be combined with each other. In addition, each interval can be divided into smaller intervals, and the sequences in FIGS. 7 to 9 can be variously combined with each other.

Note that the non-defect/defect determination of an adhesive layer can be naturally performed on the basis of only the thickness of the adhesive layer, only the degree of spread of the adhesive layer, or the combination between the thickness and the degree of spread.

In addition, in the above embodiment, data of a non-defective product are selected as a reference data string, and non-defect/defect determination is performed on the basis of a degree of similarity between the real data string of an actual product and the reference data string. When the data of a defective product are selected as the reference data string, and non-defect/ defect determination is performed on the basis of a degree of similarity between the real data string and this reference data string, the same effect as described above can be obtained. Non-defect/defect determination may be performed such that determination based on a non-defective product and determination based on a defective product are simultaneously used.

In the mount apparatus with the above arrangement, the non-defect/defect determination of an adhesive layer can be performed without picking a product from the mount apparatus immediately after a mounting operation. For this reason, the non-defect/defect determination of all products which cannot be realized by a conventional technique can be performed by the mount apparatus.

A die-bonder to which the present invention is applied will be described below.

Figure 10:
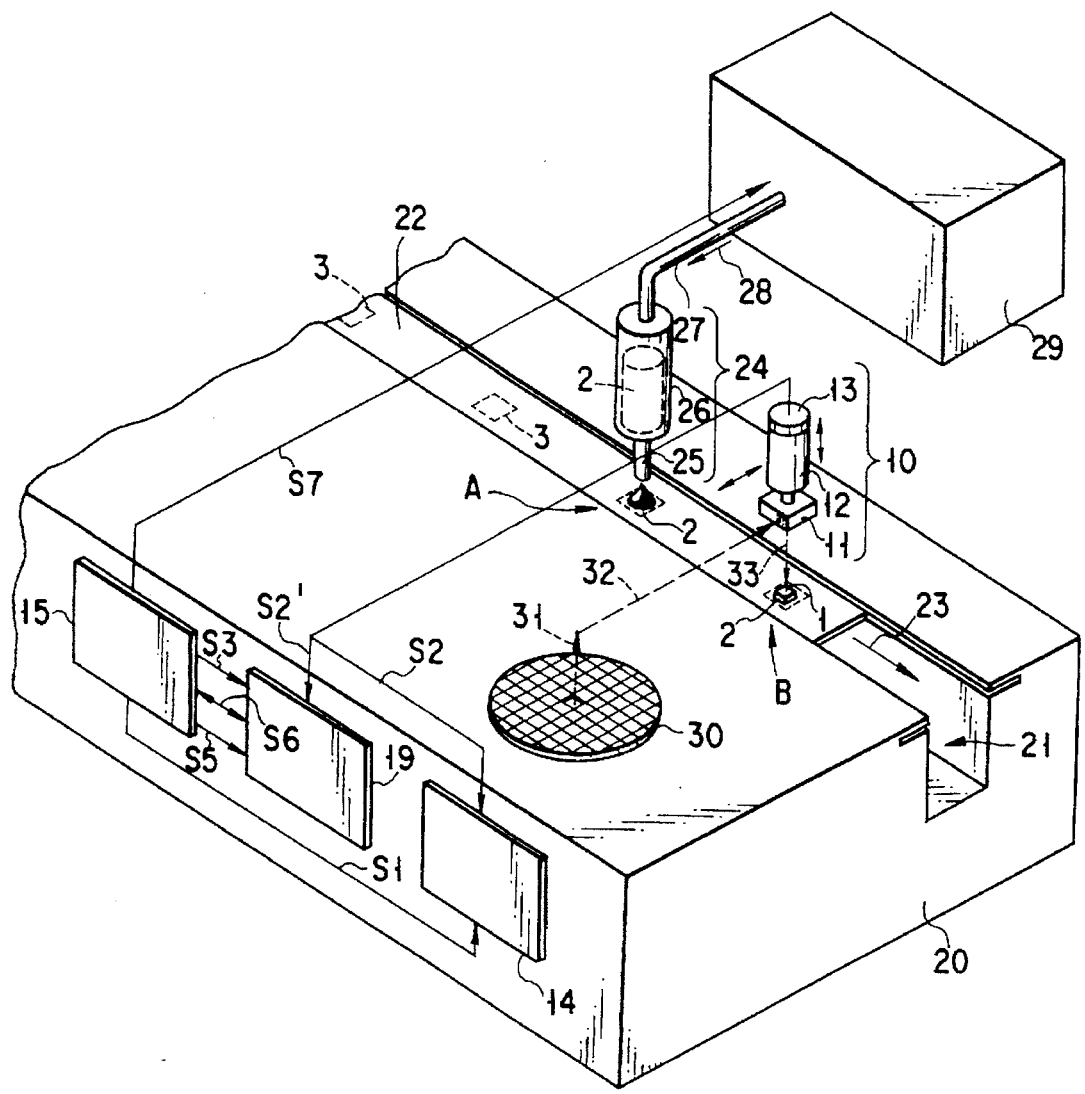
FIG. 10 is a perspective view showing a die-bonder to which the present invention is applied.

FIG. 10 is a perspective view showing a die-bonder to which the present invention is applied.

A convey path 21 is formed in a main body 20. In the convey path 21, a lead frame 22 is conveyed in the direction indicated by an arrow 23. Beds 3 are linearly arranged on the read frame 22. The linearly arranged beds 3 reach a first work point A such that the lead frame 22 is conveyed in the direction indicated by the arrow 23.

At the work point A, the step of dropping an adhesive on each of the beds 3 is performed. For this reason, a dispenser 24 is arranged at the work point A. The dispenser 24 is constituted by a dispenser nozzle 25 for discharging the adhesive 2 (resin for adhesion), a cylinder 26 for storing the adhesive 2, and a pipe 27 for supplying discharge control air 28 to the cylinder 26. The pipe 27 is connected to a control box 29 for controlling the dispenser 24. The control box 29 supplies the discharge control air 28 at timings of discharging the adhesive 2 in an assembly line. As another function, the control box 29 controls the flow rate of the adhesive 2. A flow control unit (not shown) is arranged in the control box 29, and a dropping amount of the adhesive is adjusted by operating the flow-rate control unit.

After the adhesive 2 is dropped on each of the beds 3 at the first work point A, the lead frame 22 is conveyed in the direction indicated by the arrow 23 to reach a second work point B.

At the work point B, the step of mounting the semiconductor chips (dies) 1 on the beds 3 is performed. At this point, the mount apparatus shown in FIG. 2 is arranged.

Reference numeral 30 denotes a wafer which is died. The mount head 10 lifts one chip 1 from the wafer 30 by using the collet 11 in the direction indicated by an arrow 31. When the collet 11 lifts one chip 1, the mount head 10 is moved to the work point B by a driver (not shown) in the direction indicated by an arrow 32. This driver (not shown) moves the mount head 10 itself. The driver is arranged independently of the driver 12 for driving the collet 11, and is controlled by the driving circuit 14 like the driver 12.

When the mount head 10 reaches the work point B, the operations described with reference to FIGS. 4A to 4E. That is, the mount head 10 moves in the direction indicated by an arrow 33. At this time, the position sensor 13 samples the position of the collet 11 and transfers it to the determination unit 19 and the driving circuit 14. Thereafter, on the basis of the determining method described with reference to FIG. 7, 8, or 9, it is determined whether adhesion of the chip 1 is correctly performed.

When it is determined that the adhesion of the chip 1 is correctly performed, the assembly line on the above manufacture line is continued.

When it is determined that the adhesion of the chip 1 is not correctly performed, the production line is stopped, and an adjustment unit (not shown) arranged in the control box 29 is (e.g., manually) controlled. In this manner, after a dropping amount of the adhesive 2 is adjusted, and the defective mode is canceled, the manufacture line is started again. The adjustment may be performed using the main controller 15. In this case, an adjustment signal S7 is input from the main controller 15 to the control box 29.

In addition, after it is determined that the adhesion of the chip 1 is not correctly performed, the adjustment signal S7 can be automatically input to the control box 29 such that the defective mode is canceled in accordance with the defective mode.

As has been described above, according to the present invention, there is provided a mount apparatus capable of performing non-defect/defect determination of an adhesive layer immediately after a mounting operation and detecting a defective product in real time.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A mount apparatus used in manufacturing a semiconductor device, comprising:
   means for pressing a semiconductor chip on an adhesive layer on a mount substrate;
   means for detecting variation of position of said semiconductor chip during a period of time from a first time point, at which said semiconductor chip at least contacts said adhesive layer, to a second time point; and
   means for determining whether or not said semiconductor chip is correctly adhered to the mount substrate, said determining means including
   means for sampling variation of the position of the semiconductor chip,
   means for preparing a data string representing variation of the position on the basis of the position sampled by said sampling means,
   means for storing a reference value, and
   means for comparing said data string with said reference value.

2. An apparatus according to claim 1, wherein said determining means extracts from said data string, a plurality of data representing variation of the positions of said semiconductor chip immediately before the end of pressing, calculates an average value of the plurality of data to compare with said reference value, and determines whether or not said semiconductor chip is correctly adhered to the mount substrate.

3. An apparatus according to claim 1, wherein said reference value is stored as a reference data string, and said determining means calculates a coefficient of correlation of a curve of said data string and a curve of said reference data string to obtain a degree of similarity between those curves, and determines whether or not said semiconductor chip is correctly adhered to the mount substrate.

4. An apparatus according to claim 1, wherein said reference value is stored as a reference data string, and said determining means calculates characteristics of a curve of said data string and characteristics of a curve of said reference data string to obtain a degree of similarity between those characteristics, and determines whether or not said semiconductor chip is correctly adhered to the mount substrate.

5. An apparatus according to claim 4, wherein, when said data string curve and said reference data string curve are approximated by a function, said characteristics of said data string curve and said characteristics of said reference data string curve are, respectively, a characteristic term of said function.

6. An apparatus according to claim 5, wherein said function is represented as $$z = a\, b^t + c,$$

where z corresponds to position of said semiconductor chip, a is a distance of position variation between said first time point and said second time point, t is time, c is a distance equal to thickness of the adhesive layer at the second time point, and b is the characteristic term of said function.

7. An apparatus according to claim 5, wherein said function is represented as $$z = d/t,$$

where z corresponds to position of said semiconductor chip, t is time, and d is the characteristic term of said function.

8. An apparatus according to claim 1, wherein said mount substrate is a lead frame.

9. An apparatus according to claim 1, wherein said pressing means is a mount head.

10. An apparatus according to claim 9, wherein said mount head includes a collet for holding said object to be pressed and a driver for vertically driving said collet.

11. An apparatus according to claim 10, wherein said position detecting means is a position sensor, said position sensor being included in said mount head.

12. An apparatus according to claim 11, wherein said position sensor detects a vertical position of said collet.

* * * * *

UNITED STATES PATENT AND TRADEMARK OFFICE
CERTIFICATE OF CORRECTION

PATENT NO. : 5,662,763
DATED : September 02, 1997
INVENTOR(S) : Kazuyuki YAMANAKA It is certified that error appears in the above-identified patent and that said Letters Patent is hereby corrected as shown below:

Claim 6, column 13, line 22, "$Z = a\ b^t + c$" should read --$z = a\ b^t + c$--.

Signed and Sealed this

Eighth Day of September, 1998

Attest:

BRUCE LEHMAN

Attesting Officer　　　Commissioner of Patents and Trademarks